United States Patent [19]

Larrabee

[11] 3,939,098

[45] Feb. 17, 1976

[54] SUSPENSION FOR DEPOSITING A PYROELECTRIC MATERIAL

[75] Inventor: Robert Dean Larrabee, Princeton, N.J.

[73] Assignee: RCA Corporation, New York, N.Y.

[22] Filed: May 24, 1973

[21] Appl. No.: 363,669

[52] U.S. Cl. ............... 252/518; 252/500; 428/411
[51] Int. Cl.² .......................................... H01B 1/06
[58] Field of Search.......... 117/121, 169 R, 16, 167, 117/201; 252/62.9, 500, 518; 428/411

[56] References Cited
UNITED STATES PATENTS

| | | | |
|---|---|---|---|
| 2,766,760 | 10/1956 | Bogaty | 424/71 |
| 3,511,760 | 10/1956 | Beerman | 250/383 |
| 3,767,462 | 10/1973 | Larrabee | 117/201 |

OTHER PUBLICATIONS

Chem. Abst. 46; 4731 b.

Primary Examiner—Leland A. Sebastian
Assistant Examiner—E. Suzanne Parr
Attorney, Agent, or Firm—Glenn H. Bruestle; Daniel N. Calder

[57] ABSTRACT

A relatively stable suspension of particles of a glycine containing material is formed by mixing the particles in a suspending medium of an alcohol saturated with glycine. The suspension is applied to a substrate and the alcohol is evaporated to form a film of the particles on the substrate.

4 Claims, No Drawings

SUSPENSION FOR DEPOSITING A PYROELECTRIC MATERIAL

The invention herein disclosed was made in the course of or under a contract or subcontract thereunder with the Department of the Air Force.

BACKGROUND OF THE INVENTION

The present invention relates to a method of depositing a film or polycrystalline material on a substrate, and of preparing a relatively stable suspension used in the deposition method.

In making various types of electrical devices it has been found desirable to deposit on the surface of a substrate a relatively dense film of a material with the film being adhered to the substrate. Although thin films of many materials can be obtained by the well-known techniques of vacuum evaporation or sputtering, some materials cannot be satisfactorily deposited by these techniques. For example, pyroelectric materials, such as triglycine sulfate (TGS), triglycine selenate (TGSe) and the like, used in making pyroelectric detectors cannot be deposited by these techniques because they thermally decompose before they melt or exhibit appreciable vapor pressure. As described in U.S. Pat. No. 3,511,991 to H. P. Beerman, one method which has been suggested for forming a film of these materials is to mix particles of these materials with a binder, such as a plastic and apply a film of the mixture to a substrate. The binder serves to bind the particles to each other and to the substrate. However, a disadvantage of this method is that the binder may have an undesirable adverse effect on the desired properties of the resulting film.

A method which has been developed to form a film of these materials without a binder, and described in U.S. Pat. No. 3,767,462 to R. A. Larrabee, is to form a suspension of particles of the material in a volatile suspending medium which is a relatively poor solvent for the material, such as a mixture of an alcohol and water. The suspension is applied to the surface of the substrate and the suspending medium is evaporated to leave a film of the particles on the substrate. The resulting film can be made denser and more adherent by treating it with the vapors of a suitable good solvent, such as water, and drying it. Although this method results in coherent film of the material on the substrate which is adherent to the substrate and which is substantially free of other materials which may adversely affect the properties of the film, this method does have a problem. It has been found very difficult to form a stable suspension of the particles in the alcohol and water mixture. By a stable suspension it is meant that there is no visible settling of the particles for at least the length of time required to deposit the film.

SUMMARY OF THE INVENTION

A substantially stable suspension of particles of a material in a suspending medium is achieved by using a suspending medium of a mixture of an alcohol and glycine. The suspension is used to form a film of the material on a surface of a substrate by applying the suspension to the surface of the substrate and evaporating the alcohol.

DETAILED DESCRIPTION

In forming a suspension of particles of a compound material in a suspending medium, it has been found that if the compound material is slightly soluble in the suspending medium so as to introduce one component of the compound material in the suspending medium, the stability of the suspension may be relatively poor. By a poor stability it is meant that there is a tendency for the particles to settle out in a relatively short period of time. However, I have found that the stability of the suspension can be greatly improved by using a suspending medium to which is added a component of the compound material which does not adversely affect suspension stability and lowers the solubility of the compound material in the suspending medium. Preferably, the suspending medium is saturated with the additive component.

This method is particularly useful in forming a suspension for use in depositing a pyroelectric material, such as triglycine sulfate (TGS), triglycine selenate (TGSe), triglycine fluoroberyllate (TGFB) and the like, on a substrate to form a ferroelectric or pyroelectric element. As previously described, heretofore a suspension of a pyroelectric material was formed by mixing particles of the material in a suspending medium of a mixture of an alcohol and water. However, some of the pyroelectric material dissolved in the alcohol. When using triglycine sulfate or triglycine selenide, this resulted in the introduction of the sulfate or selenide radical in the suspending medium which increased the tendency of the pyroelectric material particles to agglomerate and settle so as to reduce the stability of the suspension. In accordance with the present invention, a much more stable suspension of the pyroelectric material particles is obtained by using a suspension medium of an alcohol and glycine. Suitable alcohols are isopropyl alcohol, methyl alcohol or higher molecular weight alcohols such as isobutyl alcohol. The glycine is a component of the pyroelectric material which does not tend to cause agglomeration and lowers the solubility of the pyroelectric material in the suspending medium. Preferably, the alcohol is saturated with the glycine.

A suspension of the pyroelectric material particles is formed by adding the pyroelectric material particles to a glycine saturated alcohol suspending medium and ball milling the mixture until the pyroelectric material particles are of submicron size and are suspended in the suspending medium. Preferably, the ball milling is carried out using a plastic container, such as a polyethylene container, and glass marbles. It has been found that the use of a plastic container results in a lower contamination of the suspension than if a glass or ceramic container is used, and any contaminating plastic can be removed by boiling the deposited film in trichloroethylene. In addition, a small amount of glass (e.g. 1%) contamination may be beneficial in providing adherence of the film to the substrate prior to densification.

To form a film of the pyroelectric material on a substrate using the suspension, the substrate is placed in a container and the suspension is placed in the container covering and in contact with a surface of the substrate. The alcohol of the suspending medium is then evaporated. This results in a settling of the suspended particles onto the surface of the substrate to form a film of the particles on the substrate as the alcohol evaporates. When the alcohol is completely evaporated, a small amount of the glycine from the suspending medium will remain in the deposited film, but this has not proved to be harmful. As previously stated, the deposited film of the pyroelectric material particles can be densified by treating it with water vapor, e.g. saturated water vapor at a temperature approaching the boiling point of water, and then drying the film of the entrained water.

I claim:

1. A suspension having improved stability comprising a mixture of an alcohol having one to five carbon atoms and glycine and a pyroelectric particulate material selected from the group consisting of triglycine sulfate, triglycine selenate and triglycine fluoroberyllate suspended in said mixture.

2. A suspension in accordance with claim 1 in which the alcohol is saturated with the glycine.

3. A suspension in accordance with claim 2 in which the pyroelectric particulate material contains a glycine component and another component which dissolves in the alcohol and adversely affects the suspension stability.

4. A suspension in accordance with claim 3 in which the pyroelectric material is selected from the group consisting of triglycine sulfate, triglycine selenate and triglycine fluoroberyllate.

* * * * *

UNITED STATES PATENT OFFICE
CERTIFICATE OF CORRECTION

PATENT NO. : 3,939,098
DATED : February 17, 1976
INVENTOR(S) : Robert Dean Larrabee It is certified that error appears in the above-identified patent and that said Letters Patent are hereby corrected as shown below:

Column 1, line 11        "or" should be "of"

Column 1, line 40        "R. A. Larrabee" should be "R. D. Larrabee"

Signed and Sealed this fifteenth Day of June 1976

[SEAL]

Attest:

RUTH C. MASON
Attesting Officer

C. MARSHALL DANN
Commissioner of Patents and Trademarks